United States Patent
Koontz et al.

(10) Patent No.: US 9,972,960 B1
(45) Date of Patent: May 15, 2018

(54) REFLECTION/ABSORPTION COATING FOR METALLURGICAL BONDING TO A LASER GAIN MEDIUM

(71) Applicant: RAYTHEON COMPANY, Waltham, MA (US)

(72) Inventors: Christopher R. Koontz, Manhattan Beach, CA (US); David M. Filgas, Newbury Park, CA (US); Kurt S. Ketola, Los Angeles, CA (US); Carl W. Townsend, Los Angeles, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days. days.

(21) Appl. No.: 15/381,521

(22) Filed: Dec. 16, 2016

(51) Int. Cl.
| | |
|---|---|
| *G02B 6/10* | (2006.01) |
| *H01S 3/063* | (2006.01) |
| *H01S 3/04* | (2006.01) |
| *H01S 3/094* | (2006.01) |
| *H01S 3/16* | (2006.01) |

(52) U.S. Cl.
CPC .......... *H01S 3/0637* (2013.01); *H01S 3/0405* (2013.01); *H01S 3/094003* (2013.01); *H01S 3/1643* (2013.01); *H01S 3/161* (2013.01); *H01S 3/1608* (2013.01); *H01S 3/1611* (2013.01); *H01S 3/1616* (2013.01); *H01S 3/1618* (2013.01)

(58) Field of Classification Search
None
See application file for complete search history.

(56) References Cited

U.S. PATENT DOCUMENTS

| | | | | |
|---|---|---|---|---|
| 2006/0078024 A1* | 4/2006 | Matsumura | ............ | B82Y 20/00 372/46.01 |
| 2006/0285571 A1* | 12/2006 | Sun | ........ | H01S 3/0604 372/71 |
| 2012/0114927 A1 | 5/2012 | Khaselev et al. | | |
| 2013/0243020 A1* | 9/2013 | Kim | ....... | H01S 5/0224 372/36 |

(Continued)

FOREIGN PATENT DOCUMENTS

| | | |
|---|---|---|
| EP | 2395611 A1 | 12/2011 |
| WO | 03043144 A2 | 5/2003 |

OTHER PUBLICATIONS

PCT Notification of Transmittal of The International Searching Report and The Written Opinion of the International Searching Authority, or the Declaration; International Application No. PCT/US2017/064863; International Filing Date Dec. 6, 2017; dated Feb. 26, 2018; 7 pages.

(Continued)

*Primary Examiner* — Sung Pak
(74) *Attorney, Agent, or Firm* — Cantor Colburn LLP

(57) ABSTRACT

An active optical planar waveguide apparatus includes a planar core layer comprising an active laser ion; one or more cladding layers in optical contact with at least one surface of the planar core layer; a metallic binder layer chemically bonded to an outermost cladding layer of the one or more cladding layers; a metallic adhesion layers disposed on the metallic binder layer; a heatsink for dissipating heat from the planar waveguide; and a metallic thermal interface material (TIM) layer providing a metallurgical bond between the metallic adhesion layer and the heatsink.

24 Claims, 8 Drawing Sheets

(56) References Cited

U.S. PATENT DOCUMENTS

2014/0098831 A1* 4/2014 Shigihara .............. H01S 5/1017
372/36
2015/0378093 A1 12/2015 Murgai
2017/0192177 A1* 7/2017 Nekado .................. G02B 6/325

OTHER PUBLICATIONS

PCT Written Opinion of The International Searching Authority; International Application No. PCT/US2017/064863; International Filing Date Jun. 12, 2017; dated Dec. 16, 2016; dated Feb. 26, 2018; 8 pages.

* cited by examiner

US 9,972,960 B1

REFLECTION/ABSORPTION COATING FOR METALLURGICAL BONDING TO A LASER GAIN MEDIUM

BACKGROUND

The present disclosure relates to optical waveguides, and more particularly, to coatings for optical waveguides.

An optical waveguide is a physical structure that guides electromagnetic waves in the optical spectrum. An optical waveguide is a basic element for confinement and transmission of light over various distances. Optical waveguides are used in a variety of applications, including integrated optical circuits and long distance light wave communication. One type of optical waveguide includes a solid body that transmits light, such as a laser beam, and confines the light beam to a specific region of the solid body. A planar waveguide, also known as a slab waveguide, confines the light beam to a planar region within the waveguide, thereby guiding light in only one dimension.

Some solid state optical waveguides include a core that confines light and a cladding or substrate that surrounds the core. A guided light wave propagates in the waveguide along the longitudinal direction. For example, a conventional slab waveguide may include three layers of materials. When light is injected from the side into the middle layer, light may be confined in the middle layer by total internal reflection (TIR). TIR occurs when the refractive index of the middle layer is larger than the surrounding layers.

A waveguide that has an index profile with abrupt changes between the core and cladding is called a step-index waveguide. A waveguide with an index profile that varies gradually is a graded-index waveguide. When a waveguide with an active laser ion doped into its core is used in combination with a pumping laser, an optical signal propagating in the core of the planar waveguide may be amplified. The pumping laser creates a population inversion in the active ions which enables amplification by stimulated emission of radiation as the signal passes through the waveguide. In a cladding pumped waveguide where pump light fills both the core and one or more inner cladding layers adjacent to the core, additional outer cladding layers with an even lower refractive index than the inner cladding layers may be used to provide TIR for the pump light at the inner cladding/outer cladding boundary. Beyond the core/cladding structure used to guide the pump and signal energy, within the waveguide, one or more additional layers of material may be added to the waveguide to control stray light and/or absorb amplified spontaneous emission and/or suppress parasitic oscillations. The additional layers should possess several characteristics, including the ability to absorb light and/or to reflect light back into the core and/or cladding(s). In addition, the additional layers should possess desirable mechanical properties that enable a robust interface between the waveguide and its mounting/cooling structure.

SUMMARY

According to an embodiment, an active optical planar waveguide apparatus includes a planar core layer comprising an active laser ion; one or more cladding layers in optical contact with at least one surface of the planar core layer; a metallic binder layer chemically bonded to an outermost cladding layer of the one or more cladding layers; a metallic adhesion layers disposed on the metallic binder layer; a heatsink for dissipating heat from the planar waveguide; and a metallic thermal interface material (TIM) layer providing a metallurgical bond between the metallic adhesion layer and the heatsink.

According to another embodiment, a method of making an active planar waveguide apparatus includes depositing a metallic binder layer on the surface of a waveguide; depositing a metallic adhesion layer on the metallic binder layer; and bonding by a metallurgical process a heatsink to the waveguide using a metallic thermal interface material (TIM) between the metallic adhesion layer and the heatsink.

Yet according to another embodiment, a passive optical planar waveguide apparatus includes one or more optically transparent substrates in optical contact with one another; a metallic binder layer chemically bonded to an outermost optical layer of the one or more optically transparent substrates; one or more metallic adhesion layers disposed on the metallic binder layer; and a metallic thermal interface material (TIM) layer forming a metallurgical bond to the metallic adhesion layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
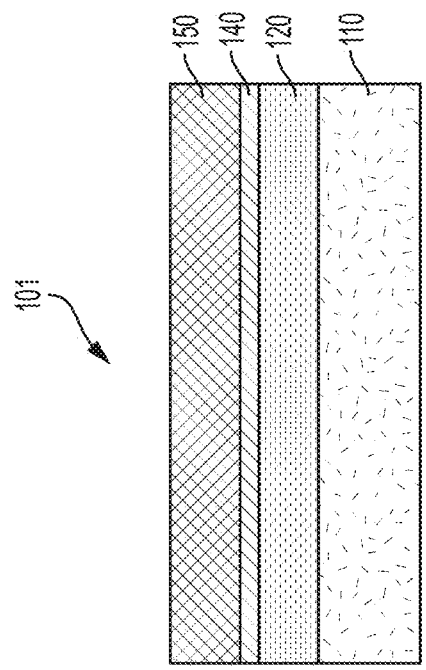
FIGS. 1A, 1B, 1C, 1D, and 1E are cross-sectional side views of optical waveguide apparatuses according to embodiments.

Planar optical waveguides are often used to construct lasers and optical amplifiers. Rectangular waveguides may include one or more layers of material designed to guide light within the waveguide by TIR. This is typically done by surrounding a higher index core layer by one or more lower index cladding layers. If an active laser ion is doped into the core of the planar waveguide and pumped by an optical pump source, the waveguide can serve as an optical amplifier or laser oscillator.

Heat is generated in active planar waveguides due to both the pumping process and background absorption of the pump and signal beams. This heat is typically removed by cooling to one or both large faces of the waveguide. As solid state planar waveguides (PWG) lasers are scaled to higher average powers, high efficiency cooling schemes are necessary to minimize the temperature rise in the PWG core. Excessive temperature rise can lead to performance degradation or fracture of the waveguide due to thermally induced stress. In particular, efficient cooling schemes that provide substantially uniform cooling across the width (slow axis) of the PWG are needed to minimize transverse temperature gradients which could degrade the beam quality of the PWG output.

Some PWG devices utilize a thermal interface material (TIM), such as a graphite gasket, in contact with one or both large surfaces of the PWG to facilitate heat removal. The TIMs may be disposed between the PWG and heatsinks. The TIMs function as thermal conductors to transfer excess heat from the PWG to the heatsinks. The heatsinks are typically configured with one or more cooling channels configured to transfer the heat to a flowing coolant. However, such gasket TIMs may not provide low enough thermal resistance or may not provide adequate cooling uniformity for optimal performance of some high power PWG devices. Additionally, such gasket TIMs may not provide suitable absorption/reflection of electromagnetic energy to control amplified spontaneous emission and/or parasitic oscillations within the PWG. Various methods of improving the TIM include, for example, using adhesives, covalent oxide bonds, and indium foils.

In one example, an additional coating on the surface of the waveguide has been employed in conjunction with a graphite TIM to enhance absorption of unwanted electromagnetic energy. This additional coating comprises a thin (i.e., 5-20 nanometer (nm)) metal layer on a PWG. The metal layer may be arranged in mechanical contact with a graphite TIM.

Sources of stray light in PWG devices include fluorescence (spontaneous emission) from the active ion, amplified spontaneous emission (ASE), scatter of the pump and signal beams, imperfect coupling of the pump and signal beams, and reflections from the sides and ends of the planar waveguide. Providing appropriate absorption/reflection of these sources of stray light at the cooled surfaces of the PWG is a key aspect of optimizing the PWG mounting/cooling approach.

Accordingly, embodiments described herein are optical waveguides that include a metallized surface that is bonded to a heatsink using a metallic TIM. The metallization may include multiple layers arranged to simultaneously maintain low near normal reflectance, providing a robust, stable mounting method with higher thermal conductance than, for example graphite. The metallization on the PWG is optimized for compatibility with metallic TIMs, such as, for example, solder, bulk silver, or bulk copper. The metallization controls unwanted incident light and forms a metallurgical bond to the metallic TIM. Optionally, in some embodiments, layers of dielectric materials may be disposed between the metallization layers on the PWG to improve functional characteristics.

It will be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

Embodiments described herein relate to an optical waveguide. The optical waveguide may be a solid state planar, or slab, waveguide. Light transmitted through the waveguide is confined to a specific planar region of the solid body. According to some embodiments, the planar waveguide may function as an optical amplifier configured to operate in a range of wavelengths. For example, the optical waveguide may operate in the 1000-1100 nanometer (nm) wavelength range, including the 1030 nm wavelength. The systems disclosed herein are also capable of operating at other wavelengths in other embodiments, including the visible to IR region of the electromagnetic spectrum, which includes wavelengths of 400-14000 nm. In some embodiments, as an amplifier, the optical waveguide functions to amplify light, such as a laser beam, at a certain wavelength. In other embodiments, as a passive optical waveguide, the waveguide does not include active lasing ions and does not function as an amplifier.

The optical waveguide may be pumped by pump lasers having various wavelengths. According to certain embodiments, the wavelength of the pumping laser (which is shorter than the emitting wavelength) is determined by the absorption spectrum of the active ion doped into the waveguide core. The angle of incidence for the pumping laser is selected according to the desired application and to considerations related to energy efficiencies. According to one or more embodiments, the pumping laser may be positioned from a side (edge) of the slab at an angle of incidence of about 0 to about 30 degrees from the surface normal. In core-pumped embodiments, the pumping laser is directed into the waveguide core such that it is largely guided within the waveguide core layer. According to other cladding-pumped embodiments, the pumping laser is directed into the waveguide such that it is guided within the core/cladding structure making multiple passes through the core layer. For example, the pumping layer may be directed into doped yttrium aluminum garnet (YAG) material, or alternatively, directed into undoped YAG material.

Turning now to the Figures, FIG. 1A is a cross-sectional side view of an optical waveguide apparatus 100 according to embodiments. The optical waveguide apparatus 100 includes a waveguide 150. In one embodiment, the waveguide 150 includes a single crystal material. In another embodiment, the waveguide 150 includes a ceramic material. According to some embodiments, the waveguide 150 may comprise one or more layers of material (see, for example, FIGS. 2A and 2B described below). The thickness of the waveguide 150 may range from about 0.05 mm to about 5 mm. As recognized by those skilled in the pertinent art, the thickness of the waveguide 150 may be of any thickness to perform the various functions of the waveguide 150 as disclosed herein.

Figure 1B:
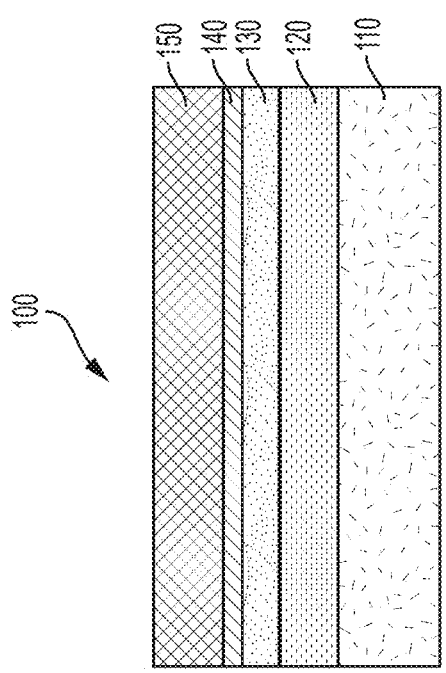
Figure 1D:
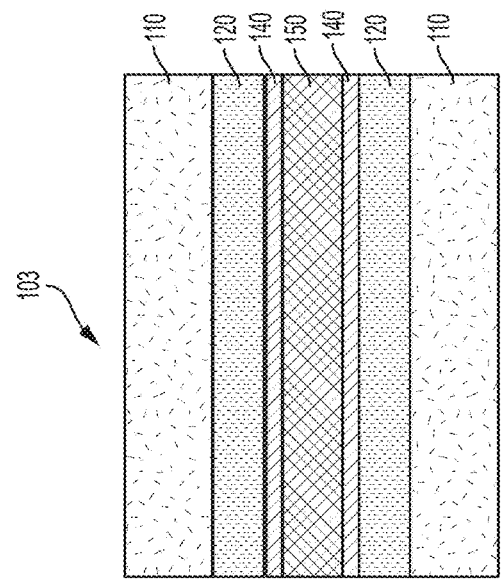
Figure 1E:
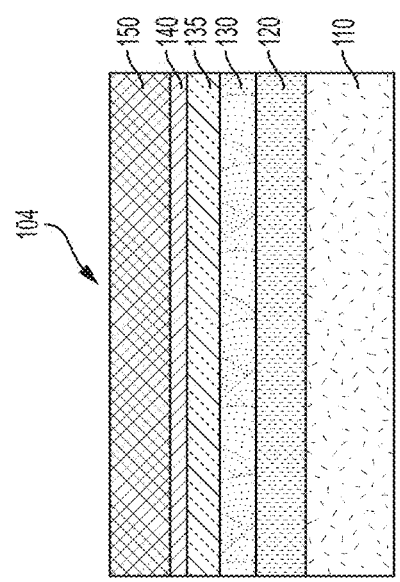
Figure 1C:
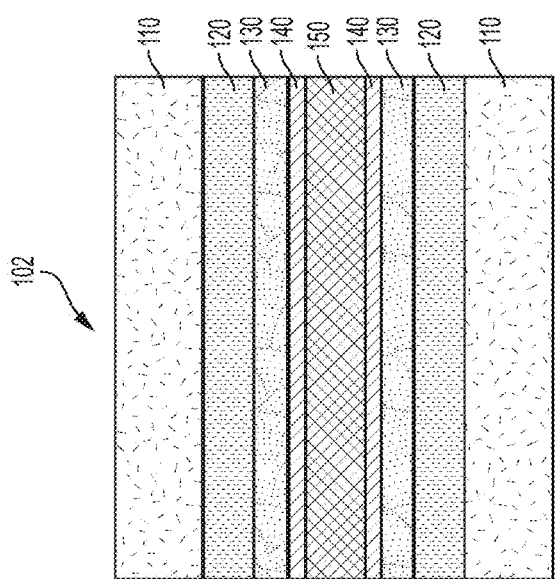
Figure 2B:
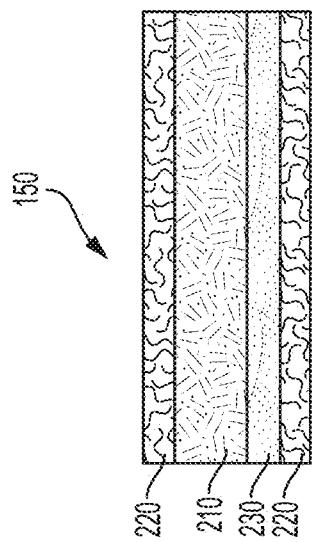
FIGS. 2A and 2B are cross-sectional side views of optical waveguides according to embodiments.
Figure 2A:
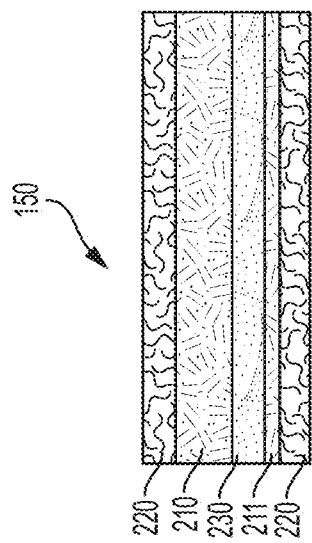

Embodiments of the waveguide 150 shown in FIG. 1A (and FIGS. 1B-1E) is described in FIGS. 2A and 2B. FIG. 2A is a cross-sectional side view of a waveguide 150 according to embodiments. The waveguide 150 includes one or more cladding layers (cladding 210 and outer cladding 220) in optical contact with at least one surface of a planar core 230. A cladding 210 is disposed on a higher index core 230 on one surface. An outer cladding 220 with an index lower than that of the cladding 210 is disposed on the outer surfaces of the core 230 and the cladding 210.

In embodiments in which the waveguide 150 is an active optical waveguide (amplifier), the core 230 includes an active laser ion. In embodiments in which the waveguide is a passive optical waveguide, the core 230 does not include an active laser ion. In at least one embodiment, the waveguide cladding 210 is YAG, and the core 230 is YAG doped with ytterbium, neodymium, erbium, thulium, holmium, or another suitable dopant. According to one or more embodiments, the waveguide core 230 may be any material that is capable of being doped with an active laser ion to efficiently absorb light from the pump laser and provide optical gain via stimulated emission. Further, the waveguide core 230 may be any material capable of propagating a signal beam in the visible to near IR region of the electromagnetic spectrum, including wavelengths of 400-14000 nm. In yet other embodiments, the waveguide may be a passive waveguide with no active dopant in the core 230. When the waveguide is a passive waveguide, the core 230 and the one or more cladding layers are optically transparent. In some embodiments, a passive optical waveguide includes one or more optically transparent substrates in contact with one another. The passive optical waveguide may include a single core or a single cladding layer, for example. In certain embodiments, the waveguide cladding 210 and waveguide core 230 may have a refractive index in a range of about 1.4 to about 2.0. In other embodiments, the waveguide cladding 210 and waveguide core 230 may have a refractive index greater than 2.0.

The outer cladding 220 has a refractive index lower than that of the cladding 210 and creates TIR at the cladding/outer cladding interface structure over a desired range of angles. In one or more embodiments, the outer cladding 220 may be silica ($SiO_2$), alumina ($Al_2O_3$), or another optical coating material which may be deposited using any conventional optical coating deposition process. The thickness of the outer cladding 220 is typically greater than about three times the pump wavelength. In at least one embodiment, the outer cladding 220 has a thickness of 3000 nm. In at least one embodiment, the waveguide 150 is a YAG material with a refractive index of 1.819 (at a wavelength of 1030 nm), and the outer cladding 220 is a layer of $Al_2O_3$ with a refractive index of 1.755.

FIG. 2B is a cross-sectional side view of a waveguide 150 according to another embodiment. A cladding 210 is disposed on a higher index core 230 on one surface. Another cladding 211 is disposed on the opposite side of the core 230. An outer cladding 220 is disposed on the outer surface of the cladding 211 and the outer surface of the cladding 210.

It is noted that the waveguides 150 shown in FIGS. 2A and 2B are not drawn to scale and are only examples. Other waveguides may be used, including any layers or other configurations of layers.

Referring again to FIG. 1A, at least one large face parallel to the layered structure of the planar waveguide 150 is coated with a metallic binder layer 140, such as the bottom surface of the waveguide 150 as shown. The waveguide 150 is optically flat on one or more surfaces, and the metallic binder layer 140 is deposited onto the flat surfaces. In at least one embodiment, the metallic binder layer 140 is arranged directly on the surface of the planar waveguide 150 without any additional layers in between. The metallic binder layer 140 is chemically bonded to an outermost cladding layer when more than one cladding layer is included.

In some embodiments, the metallic binder layer 140 has a thickness in a range from about 1 to about 100 nm. In other embodiments, the metallic binder layer 140 has a thickness in a range from about 25 to about 55 nm. In one or more embodiments, the metallic binder layer 140 has a thickness in a range from about 35 to about 45 nm. The metallic binder layer 140 should have a thickness sufficient to form a metallurgical bond with the metallic adhesion layer 130, which is described below. The metallic binder layer 140 may be thin relative to the operating wavelength and may be partially transparent. Acceptable thicknesses of the metallic binder layer 140 are approximately equal to or less than $\frac{1}{10}$ wave at the laser wavelength. The metallic binder layer 140 may be deposited using any one or more of a number of different deposition methods, including physical vapor deposition (e.g., sputtering), evaporation, or chemical vapor deposition techniques.

The metallic binder layer 140 may be an alloy. In at least one embodiment, the binder layer 140 includes chromium, nickel chromium, or a chromium alloy. In other embodiments, the metallic binder layer 140 includes titanium, titanium tungsten, or any alloy thereof. In some embodiments, the binder layer 140 includes one or more metals that can bind to the oxide based PWG or its oxide based coatings and may include one or more layers of different materials.

The metallic adhesion layer 130 is arranged on metallic binder layer 140, positioned between the metallic binder layer 140 and the metallic TIM 120. The metallic adhesion layer 130 promotes adhesion and bonding between the metallic binder layer 140, and therefore the waveguide 150, and the metallic TIM 120. The metallic adhesion layer 130 may also act as a barrier layer to minimize oxidation of the layers, such as the metallic binder layer 140. The metallic adhesion layer 130 is a metallic layer that includes a metal or metal alloy that is compatible with both the metallic binder layer 140 and the TIM 120. In one or more embodiments, the metallic adhesion layer 130 includes silver. In some embodiments, the metallic adhesion layer 130 may include copper, tin, lead, gold, indium, nickel, or any combination thereof.

The thickness of the metallic adhesion layer 130 generally varies and is not intended to be limited. In some embodiments, the metallic adhesion layer 130 has a thickness in a range from about 200 to about 2000 nm. In other embodiments, the metallic adhesion layer 130 has a thickness in a range from about 300 to about 600 nm. In one embodiment, the metallic adhesion layer 130 has a thickness in a range from about 1500 to about 2000 nm.

The binder layer 140 in combination with the adhesion layer 130 and any additional optional intermediate layers are collectively referred to as the metallization. It is desirable that the metallization has one or more functional characteristics that enhance the performance of the planar waveguide. For example the metallization may function as an optical absorber to control stray light, minimize ASE, and suppress parasitic oscillations. For example, at a wavelength of 1000 nm, the metallization may have a reflectivity of less than about 50%. According to another example, the metallization may have a reflectivity of less than 10% at angles of incidence that are less than 70 degrees. Yet according to another embodiment, the reflectivity at an interface between the one or more cladding layers and the metallic binder layer 140 is less than 50% at angles of incidence from 0-30 degrees. In some embodiments, the reflectivity at an interface between the one or more cladding layers and the metallic binder layer 140 is less than 20% at angles of incidence from 0-45 degrees. When the waveguide apparatus is a passive waveguide, the one or more cladding layers are optically transparent, and the reflectivity at the interface between the one or more optically transparent substrates to the metallic binder layer is less than 20% at angles of incidence from 0-45 degrees. The metallic binder layer 140 may also have a chemical affinity for the oxide-based planar waveguide or outer cladding, such that favorable adhesion is obtained between the planar waveguide and the metallization.

It is desirable that the metallization has properties of high absorption and low reflectance over a wide range of angles for light incident from inside the optical waveguide. The metallization includes reflective, absorptive, and bonding properties that enable it to enhance the performance of the optical waveguide. The metallization may attenuate unwanted propagation modes. The metallization may also minimize light from being reflected back into the waveguide 150.

The adhesion layer 130 may be formed by various methods. In one exemplary embodiment, the adhesion layer is formed as a film by physical vapor deposition techniques, such as sputtering or electron beam evaporation during the same coating run in which the metallic binder layer 140 is deposited. In another embodiment, the metallic adhesion layer 130 is formed by autocatalytic (electroless) plating, which may be followed by electrolytic plating.

The metallic adhesion layer 130 bonds to the metallic TIM 120. The metallic TIM 120 provides a metallurgical bond between the metallic adhesion layer 130 and the heatsink 110. The metallic TIM 120 is formed from one or more metals. In some embodiments, the metallic TIM 120 is formed from a metallic solder or bulk silver. In yet another embodiment, the metallic TIM 120 is formed from bulk copper. Compared to a gasket TIM, which generally has poorer thermal performance and may include inherent air gaps or voids that can increase reflections, the metallic TIM 120 forms a metallurgical bond with the adhesion layer 130. The metallization reduces undesired reflected light that can occur when gasket TIMs, such as graphite, are used. Bonding the waveguide to the heatsink 110 with a metallic TIM 120 is mechanically stable and does not require continuous clamping as required with a gasket TIM. The metallic TIM 120 also creates a higher thermal conductance interface than a gasket TIM.

In one or more embodiments, the metallic TIM 120 is formed from sintered metal or solder, for example, formed from silver particles. In some embodiments, the metallic TIM 120 is formed from silver particles having an average diameter in a range from 20-40 nm. Other examples of metallic materials for the metallic TIM 120 include, but are not limited to, sintering materials that include a metal powder, a binder, and a solvent. Non-limiting examples of metal powders include silver, gold, copper, palladium, and aluminum, indium, or a combination thereof. Alloys or mixtures of metals may be used, for example, silver palladium alloys, indium alloys, or gold palladium alloys. The particle size of the metal powder may vary based on desired characteristics of the formulation for an intended application. In some embodiments, metal powder with a $d_{50}$ range of from about 0.001 to about 100 micrometers may be used. In certain embodiments, metal powder with a $d_{50}$ range of from about 0.001 to about 10 micrometers may be used. In one or more embodiments, metal powder with a $d_{50}$ range of from about 0.001 to about 0.01 micrometers may be used. In some embodiments, the particle size of the metal powder may be on the nanoscale. In some embodiments, the particle size may be about 10 to about 100 nanometers. In still other embodiments, the particle size may be about 10 to about 60 nanometers. In at least one non-limiting embodiment, the particle size may be about 20 nanometers. In some non-limiting embodiments, nanosilver particles may be used. Sintering materials and particles with a $d_{50}$ range of from about 0.001 to about 100 micrometers may promote chemical bonding to occur at lower temperatures than the melting temperature of the material.

In accordance with one or more embodiments, the silver powder may be applied as a pre-laminated layer. In accordance with one or more embodiments, the silver powder may be blended with a binder and applied by silk screening. In accordance with one or more embodiments, a binder combined with the metal powder may provide strength and flexibility to the layer subsequent to drying. The binder may also provide adhesion of the formulation to the metallic adhesion layer 130 to facilitate film formation. In yet another embodiment, the silver powder may be applied by aerosol jet.

In addition to using silver nanoparticles to form the metallic TIM 120, other metal compositions may be used. In one example, silver solder alloy may be used to form the metallic TIM 120.

In accordance with one or more embodiments, metallic TIM 120 may be applied to the surface of the metallic adhesion layer 130 and then dried to form a layer. Other various techniques may be used to form the metallic TIM 120. In some embodiments, a printing technique may be used. Non-limiting examples of printing techniques include inkjet, pad, screen, stencil, tape caster, gravure and offset printing. Other deposition methods may include recasting and spray techniques.

The thickness of the metallic TIM 120 may generally vary and is not intended to be limited. In some embodiments, the metallic TIM 120 has a thickness in a range from about 10 to about 200 micrometers. In one or more embodiments, the metallic TIM 120 has a thickness in a range from about 30 to about 50 micrometers.

The metallic TIM 120 also enables bonding to a heatsink 110. The energy that is absorbed by the metallization is thermally conducted through the metallic TIM 120 to the heatsink 110 for removal. In some embodiments, the heatsink 110 may be a microchannel heatsink. In other embodiments, the heatsink 110 may be formed from sheets of copper foils with alternating fins and channels. The metallic TIM 120 couples the waveguide to the heatsink 110 through a metallic bond with minimal voiding.

In some embodiments, the heatsink 110 may be coated with indium, and the metallic adhesion layer 130 may be formed from indium. The metallic TIM 120 may be formed by pressing the heatsink 110 to the waveguide 150 at a temperature and pressure sufficient to enable the indium surfaces to diffuse (not melt), forming a void free bond or a substantially void free bond. In some embodiments, the heatsink 110 has a coefficient of thermal expansion (CTE) matched to the planar core (as shown in FIGS. 2A and 2B) to within 2 parts per million/degrees Celsius (ppm/° C.). In at least one embodiment, the heatsink 110 has a CTE matched to the planar core to within 1 parts per million/degrees Celsius (ppm/° C.).

FIG. 1B is a cross-sectional side view of an optical waveguide apparatus 101 according to embodiments. The broad surface of the waveguide 150 is coated with the metallic binder layer 140. The metallic binder layer 140 is the metallization layer that directly bonds to the metallic TIM 120 without the metallic adhesion layer 130 shown in FIG. 1A. The metallic TIM 120 bonds to the heatsink 110. The waveguide 150 is directly bonded to the metallic TIM 120 through a metallic bond with minimal voiding. The waveguide 150 is therefore also directly bonded to the heatsink 110 with minimal voiding.

FIG. 1C is a cross-sectional side view of an optical waveguide apparatus 102 according to embodiments. Two surfaces (top and bottom surfaces) of the waveguide 150 are bonded to heatsinks 110 to provide dual sided cooling of the waveguide. A metallic binder layer 140 and metallic adhesion layer 130 (the metallization) are arranged between a metallic TIM 120 on two surfaces of the waveguide 150.

FIG. 1D is a cross-sectional side view of an optical waveguide apparatus 103 according to embodiments. Two surfaces (top and bottom surfaces) of the waveguide 150 are bonded to heatsinks 110 to provide dual sided cooling of the waveguide. In this embodiment, the metallic TIM 120 bonds directly to the metallic binder layer 140 (the metallization).

FIG. 1E is a cross-sectional side view of an optical waveguide apparatus 104 according to embodiments. The broad surface of the waveguide 150 is coated with the metallic binder layer 140. One or more intermediate layers 135 are arranged along the metallic binder layer 140, positioned between the metallic binder layer 140 and the metallic adhesion layer 130. The metallic adhesion layer 130 is a metallic layer that includes a metal or metal alloy that is compatible with the one or more intermediate layers 135 and the metallic TIM 120. The metallic TIM 120 bonds to the heatsink 110. The waveguide 150 is directly bonded to the metallic TIM 120 through a metallic bond with minimal voiding. The waveguide 150 is therefore also directly bonded to the heatsink 110 with minimal voiding.

The intermediate layer 135 may include one or more layers, which may be the same or different. The metallic binder layer 140 and one or more intermediate layers 135 may be thin relative to the light wavelength and therefore partially transparent. In some embodiments, each of the intermediate layers 135 has a thickness in a range from about 1 to about 100 nm. In other embodiments, the each intermediate layers 135 has a thickness in a range from about 25 to about 55 nm. In yet other embodiments, the intermediate layers 135 include a dielectric layer that has an optical thickness of approximately ¼ wave at the laser wavelength. The intermediate layers 135 should have a thickness sufficient to form a metallurgical bond or other bonds, such as van der Waals or ionic bonding, with the metallic adhesion layer 130 and the metallic binder layer 140. The intermediate layers 135 may be deposited using any one or more of a number of different deposition methods, including physical vapor deposition (e.g., sputtering), evaporation, or chemical vapor deposition techniques.

The intermediate layers 135 may include a metal, metal alloy, dielectric, or any number and combination thereof. In at least one embodiment, the intermediate layers 135 include titanium, titanium tungsten, nickel, nickel chromium, gold, or any combination thereof. In other embodiments, the intermediate layers 135 include a dielectric layer of germanium, silicon, $SiO_2$, $HfO_2$, $Nb_2O_5$, $Ta_2O_5$, or any combination thereof.

The intermediate layers 135 may have one or more functional characteristics. For example, the intermediate layers 135 in combination with the metallic binder layer 140 and metallic adhesion layer 130 may have a high extinction coefficient, k, which allows the metal material to absorb light energy propagating in the waveguide substrate 150. For example, in some embodiments, the intermediate layers 135 in combination with the metallic binder layer 140 and metallic adhesion layer 130 has an extinction coefficient of at least 3 at a wavelength of 1030 nm. The intermediate layers 135 in combination with the metallic binder layer 140 and metallic adhesion layer 130 may also have low reflectance. For example, at a wavelength of 1000 nm, the intermediate layers 135 in combination with the metallic binder layer 140 and metallic adhesion layer 130 may have a reflectivity of less than about 40%. According to another example, the intermediate layers 135 in combination with the metallic binder layer 140 and metallic adhesion layer 130 may have a reflectivity of less than 40% at angles of incidence that are less than 70 degrees. In yet other examples, the metallic binder layer 140 does not improve the functional characteristics.

Figure 3A:
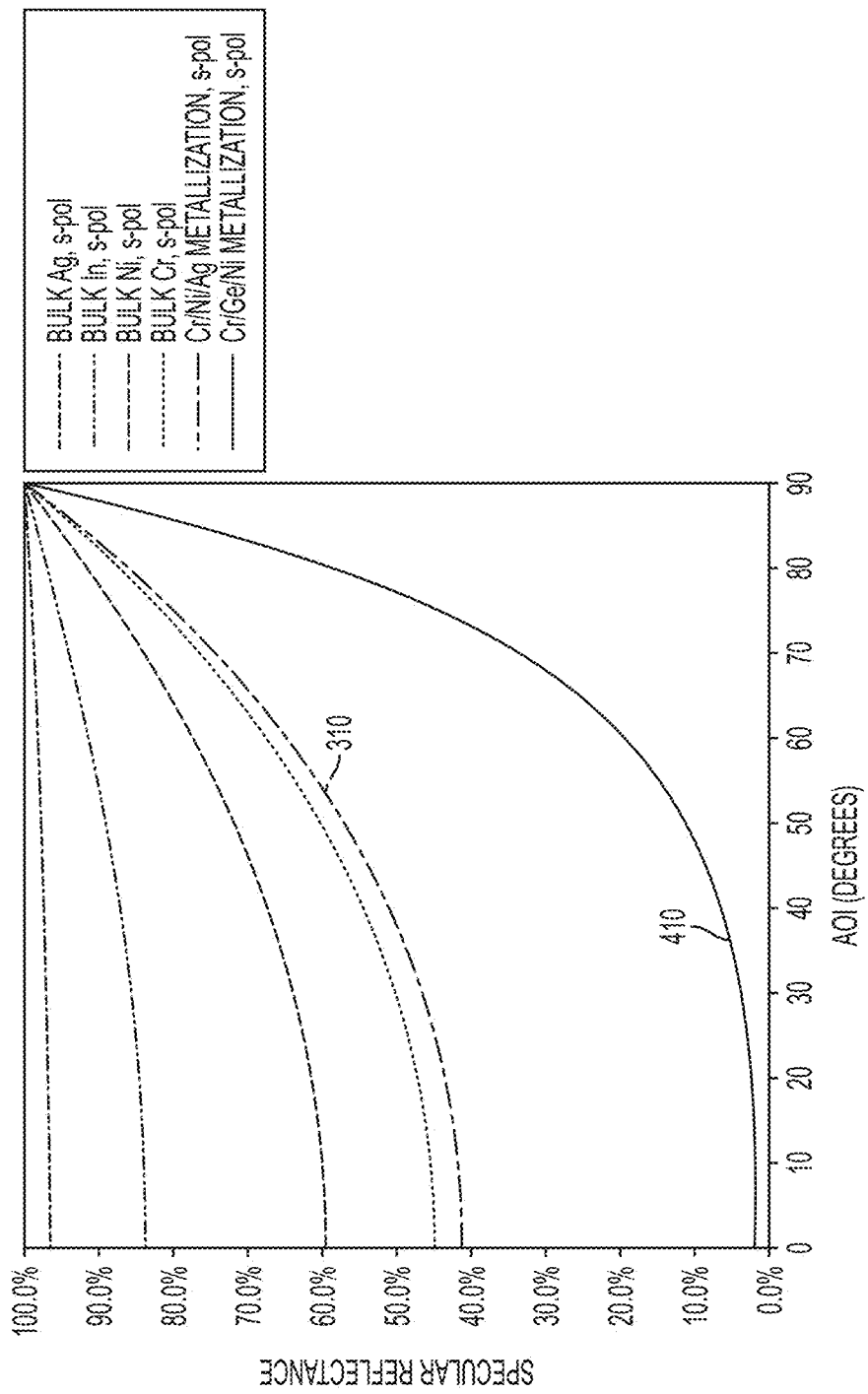
FIG. 3A is a graph illustrating the s-polarized reflectivity vs. angle of incidence for light incident at the interface from the outer cladding layer to the metal binder layer for a variety of different metallization options.

FIG. 3A is a graph illustrating the s-polarized reflectivity vs. angle of incidence for light incident at the interface from the outer cladding layer to the metallic binder layer for a variety of different metallization options.

Figure 3B:
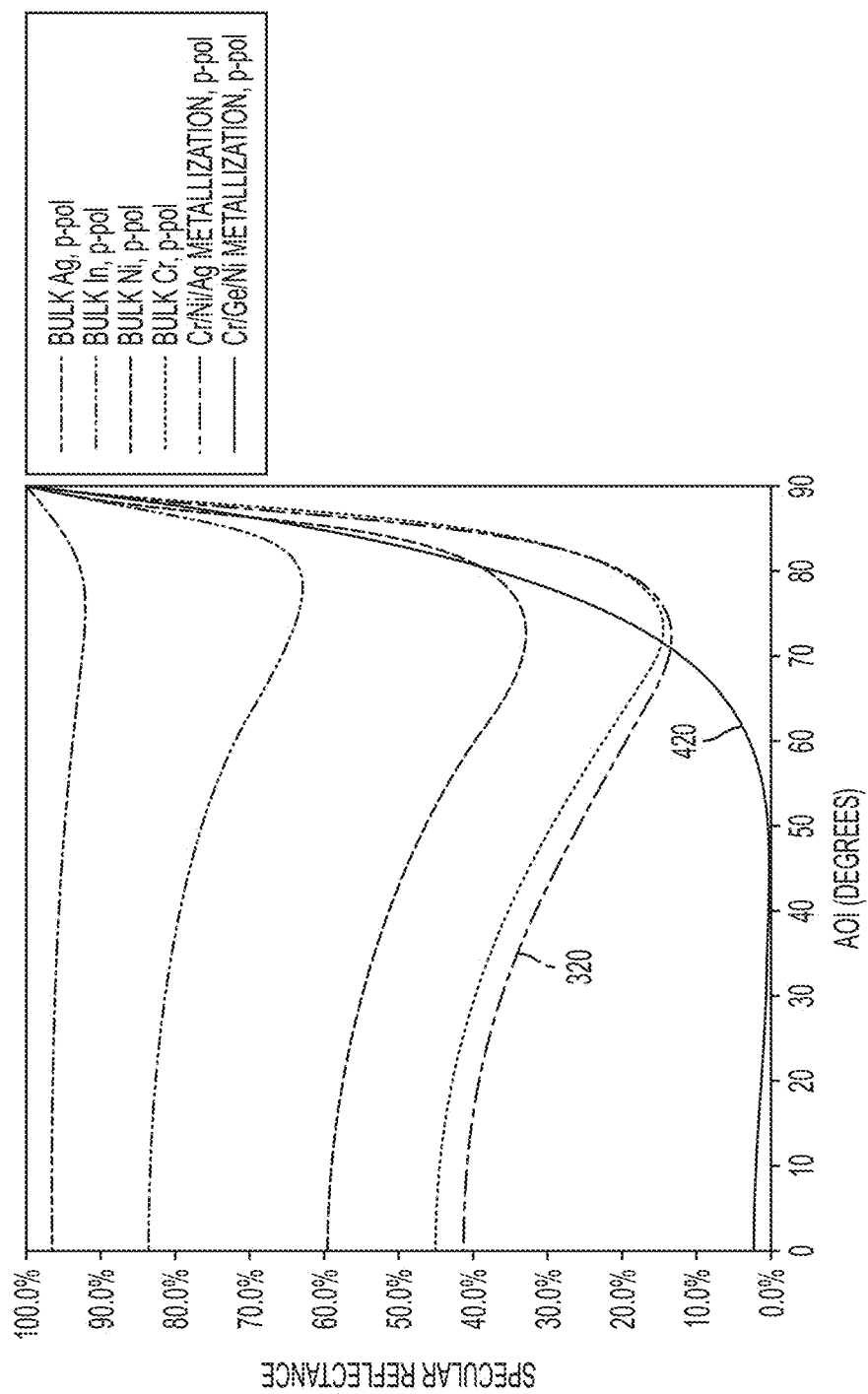
FIG. 3B is a graph illustrating the p-polarized reflectivity vs. angle of incidence for light incident at the interface from the outer cladding layer to the metal binder layer for a variety of different metallization options.

FIG. 3B is a graph illustrating the p-polarized reflectivity vs. angle of incidence for light incident at the interface from the outer cladding layer to the metallic binder layer for a variety of different metallization options.

Trace 310 (FIG. 3A) and trace 320 (FIG. 3B) illustrate performance for a thin (40 nm) chromium binder layer followed by a 400 nm nickel intermediate layer and 400 nm silver adhesion layer according to the present invention. Trace 410 (FIG. 3A) and trace 420 (FIG. 3B) illustrate performance for a thin (5 nm) chromium binder layer followed by a 35 nm germanium intermediate layer, a 400 nm nickel intermediate layer, and a 400 nm silver adhesion layer according to the present invention. Thin film modeling was performed using conventional thin film modeling tools. The modeled data closely corresponded with the experimental data, validating the simulation tool as a viable method for optimizing the thickness of the metalized layers without having to run many trial-and-error tests to optimize optical performance. Use of a thin metallic binder layer thus allows a reduction in the reflection from the interface compared to use of a thick metal layer alone. Use of a thin metallic binder layer in conjunction with a dielectric intermediate layer achieved very high optical absorption over a wide range of angles which can be highly beneficial for absorbing fluorescence and stray light in a planar waveguide amplifier. Thus, to minimize the reflectivity near normal incidence, the optimum thickness for the dielectric layer is approximately ¼ of operating wavelength of the amplifier divided by the index of refraction of the dielectric layer at that wavelength. Acceptable thicknesses for the dielectric layer are odd multiples of ¼ of operating wavelength of the amplifier, such as ¼, ¾, 5/4, etc., divided by the index of refraction of the dielectric layer at that wavelength.

Figure 5:
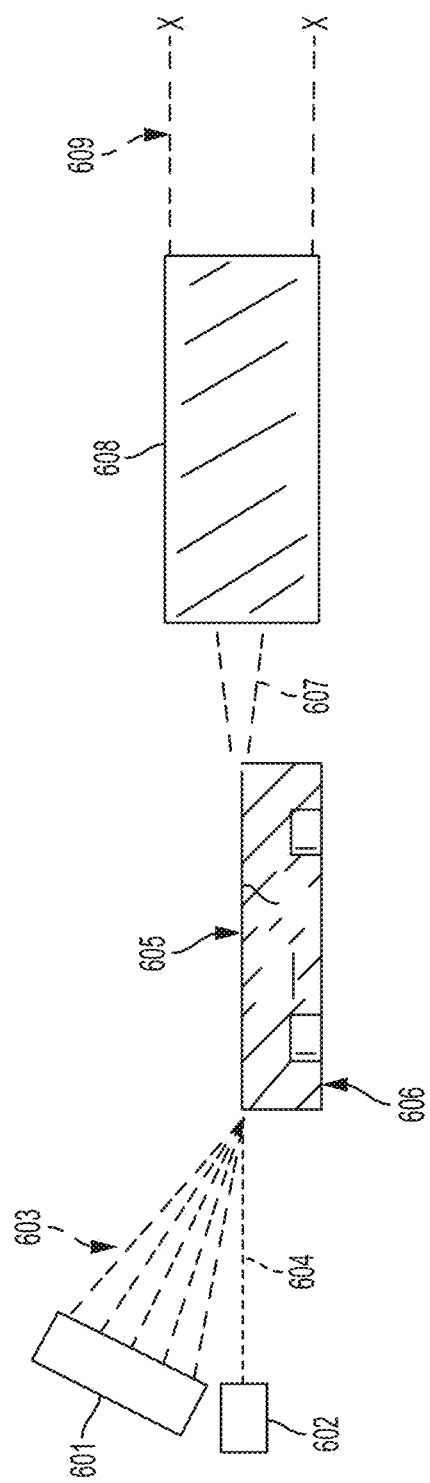
FIG. 5 is an illustration of an optical waveguide apparatus receiving and reflecting light energy from a pumping laser.

FIG. 5 is an illustration of an optical waveguide apparatus. A pumping source 601 outputs pump power 603, and a master oscillator 602 outputs a low power optical signal 604. The pump power 603 and the optical signal 604 are coupled to the the optical waveguide 605 at an angles of incidence selected according to the desired application and to considerations related to energy efficiencies. A heatsink 606 is in thermal contact with the optical waveguide 605. The optical waveguide 605 amplifies the low power optical signal 604 and outputs a high power optical signal 607. The high power optical signal 607 may be collimated and/or re-shaped by output optics 608 to produce the high power output beam 609.

Figure 6:
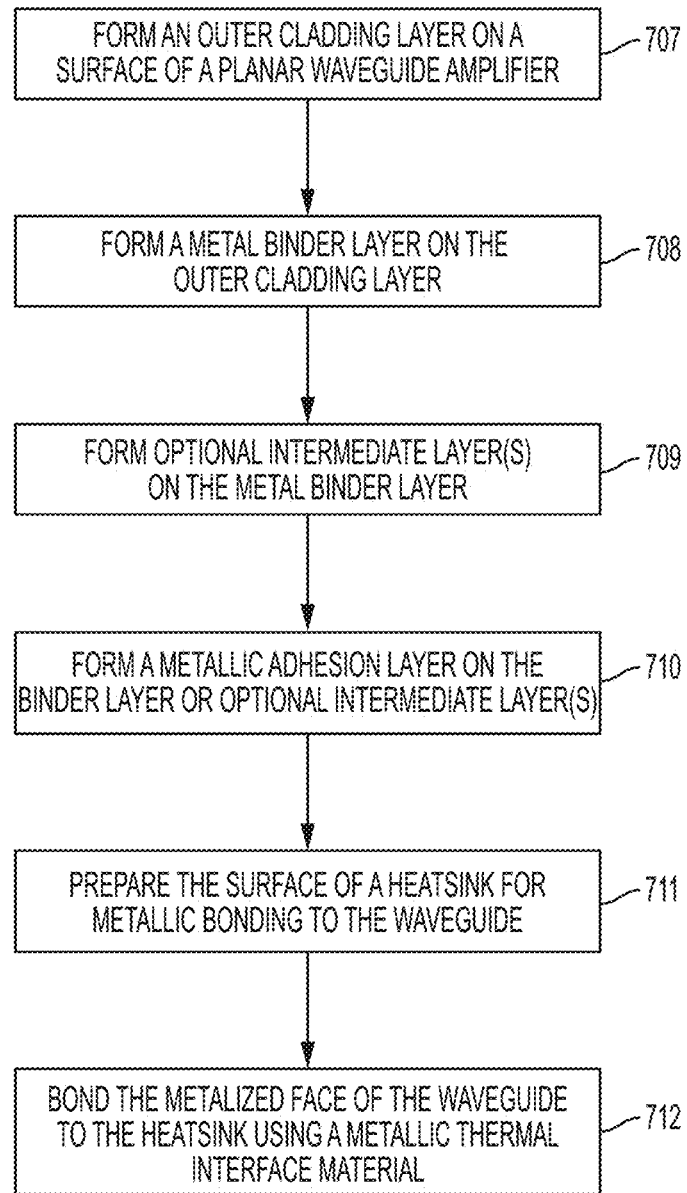
FIG. 6 is a flow diagram of a method of making an optical waveguide apparatus according to embodiments.

FIG. 6 is a flow diagram of a method of making an optical waveguide apparatus according to embodiments. At box 707, an outer cladding is formed on a planar waveguide. At box 708, a metal binder layer is formed on the outer cladding. At box 709, one or more optional intermediate layers are formed on the metal binder layer. At box 710, a metallic adhesion layer is formed on the metal binder layer or optional one or more intermediate layers. At box 711, a heatsink surface is prepared for metallic bonding. At box 712, the planar waveguide is bonded to a heatsink using a metallic thermal interface material.

EXAMPLES

The metallization and bonding processes were developed using microscope slides as surrogate for the planar waveguide. A glass slide was coated with a 45 nm thick layer of nickel chromium and a 400 nm thick layer of silver. Nanosilver paste was used to bond a second identically coated glass slide to the surface of the first coated glass slide. A void-free, high thermal conductivity bond was achieved. FIG. 4A is a side view of the bonded glass slides.

The bonded glass slides were subjected to six thermal shocks, between room temperature and 77 Kelvin (K). The bonded glass slides did not show any indications of delamination following the shocks.

Figure 4B:
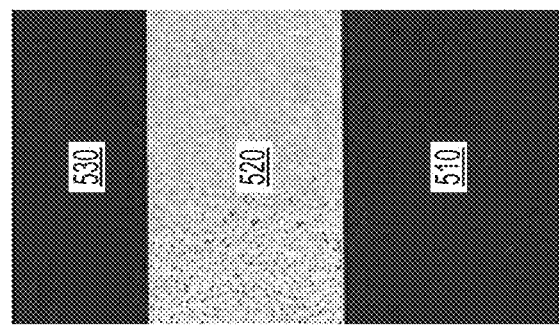
FIG. 4B is a cross-sectional side view of FIG. 4A through the x-axis.
Figure 4A:
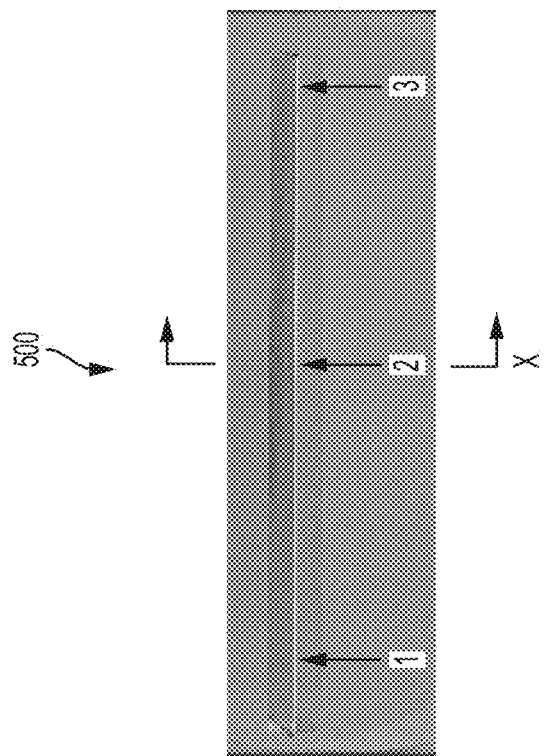
FIG. 4A is a side view of glass slides bonded together with layers of nickel chromium, silver, and nanosilver paste.

FIG. 4B shows a magnified cross-sectional side view of the bondline in FIG. 4A through the x-axis. As shown, first coated slide 510 is bonded to second glass slide 530 with nanosilver paste 520 with minimal voiding in between.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An active optical planar waveguide apparatus, comprising:
    a planar core layer comprising an active laser ion, the planar core layer guiding light in only one dimension;
    one or more cladding layers in optical contact with at least one surface of the planar core layer;
    a metallization layer comprising one or more metallic layers chemically bonded to an outermost cladding layer of the one or more cladding layers;
    a heatsink for dissipating heat from the planar waveguide; and
    a metallic thermal interface material (TIM) layer providing a metallurgical bond between the metallization layer and the heatsink, the TIM having a thickness of about 10 to about 200 micrometers.

2. The active optical planar waveguide apparatus of claim 1, wherein the metallization layer comprises two layers, a metallic binder layer and a metallic adhesion layer, and the metallic TIM is arranged between the metallic adhesion layer and the heatsink.

3. The active optical planar waveguide apparatus of claim 2, wherein the metallic binder layer has a thickness equal to or less than $1/10$ wave at a laser wavelength.

4. The active optical planar waveguide apparatus of claim 2, wherein the metallic binder layer is chromium, titanium, tungsten, nickel, or any combination thereof.

5. The active optical planar waveguide apparatus of claim 2, wherein the metallic adhesion layer is silver, copper, gold, nickel, or any combination thereof.

6. The active optical planar waveguide apparatus of claim 2, wherein a reflectivity at the one or more cladding layers to metallic binder layer interface is less than 50% from 0 to 30 degrees angles of incidence.

7. The active optical planar waveguide apparatus of claim 1, wherein a reflectivity at the one or more cladding layers to metallic binder layer interface is less than 20% from 0 to 45 degrees angles of incidence.

8. The active optical planar waveguide apparatus of claim 2, further comprising one or more additional metallic or dielectric layers disposed between the metallic binder layer and the metallic adhesion layer.

9. The active optical planar waveguide apparatus of claim 8, wherein the one or more additional dielectric layers is germanium, silicon, $SiO_2$, $HfO_2$, $Nb_2O_5$, $Ta_2O_5$, or any combination thereof.

10. The active optical planar waveguide apparatus of claim 1, wherein the metallic TIM is silver, gold, indium, copper, or a metal solder, and the TIM has a thickness in a range from about 10 to about 200 microns.

11. The active optical planar waveguide apparatus of claim 1, wherein the heatsink has a coefficient of thermal expansion (CTE) matched to the planar core layer to within 2 parts per million/degrees Celsius (ppm/° C.).

12. A method of making an active planar waveguide apparatus, the method comprising:
    depositing a metallic binder layer on a surface of an optically flat surface of a planar waveguide, the planar waveguide guiding light in only one dimension;
    depositing a metallic adhesion layer on the metallic binder layer; and
    bonding by a metallurgical process a heatsink to the waveguide using a metallic thermal interface material (TIM) between the metallic adhesion layer and the heatsink, the metallic TIM having a thickness of about 10 to about 200 micrometers.

13. The method of claim 12, wherein the metallic TIM is silver, copper, indium, or a combination thereof.

14. The method of claim 12, wherein the metallic TIM comprises a sintered metal.

15. The method of claim 12, wherein the sintered metal is formed from nanoparticles.

16. The method of claim 15, wherein an intermediate layer of metal or dielectric material is deposited between the metallic binder layer and the metallic adhesion layer.

17. A passive optical planar waveguide apparatus, comprising:
    one or more optically transparent planar waveguide substrates in optical contact with one another, the one or more optically transparent planar waveguide substrates guiding light in only one dimension;
    a metallic binder layer chemically bonded to an outermost optical layer of the one or more optically transparent substrates;
    one or more metallic adhesion layers disposed on the metallic binder layer; and a metallic thermal interface material (TIM) layer forming a metallurgical bond to the metallic adhesion layer, the metallic TIM having a thickness of about 10 to about 200 micrometers.

18. The passive optical planar waveguide apparatus of claim 17, further comprising an additional metal layer disposed between the metallic binder layer and the one or more metallic adhesion layers.

19. The passive optical planar waveguide apparatus of claim 17, further comprising an additional dielectric layer disposed between the metallic binder layer and the one or more metallic adhesion layers.

20. The passive optical planar waveguide apparatus of claim 19, wherein the additional dielectric layer is germanium, silicon, $SiO_2$, $HfO_2$, $Nb_2O_5$, $Ta_2O_5$, or any combination thereof.

21. The passive optical planar waveguide apparatus of claim 17, wherein the metallic binder layer is chromium, titanium, tungsten, nickel, or any combination thereof.

22. The passive optical planar waveguide apparatus of claim 17, wherein the one or more metallic adhesion layers is silver, copper, gold, nickel, or any combination thereof.

23. The passive optical planar waveguide apparatus of claim 17, wherein the metallic TIM is silver, gold, indium, copper, or a metal solder, and the TIM has a thickness in a range from about 10 to about 200 microns.

24. The passive optical planar waveguide apparatus of claim 17, wherein a reflectivity at the one or more optically transparent substrates to metallic binder layer interface is less than 50% from 0 to 30 degrees angles of incidence.

* * * * *